(12) United States Patent
Tousignant

(10) Patent No.: US 8,736,312 B2
(45) Date of Patent: May 27, 2014

(54) SYSTEMS AND METHODS FOR COMPENSATING THE INPUT OFFSET VOLTAGE OF A COMPARATOR

(71) Applicant: Honeywell International Inc., Morristown, NJ (US)

(72) Inventor: Daniel Tousignant, St-Jean-sur-Richelieu (CA)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 13/920,875

(22) Filed: Jun. 18, 2013

(65) Prior Publication Data

US 2013/0278293 A1    Oct. 24, 2013

Related U.S. Application Data

(63) Continuation of application No. 13/420,274, filed on Mar. 14, 2012, now Pat. No. 8,493,098.

(51) Int. Cl.
  *H03K 17/13*    (2006.01)
(52) U.S. Cl.
  USPC .............................................. 327/79; 327/87
(58) Field of Classification Search
  USPC ................... 327/77–79, 85, 87, 89
  See application file for complete search history.

(56) References Cited

U.S. PATENT DOCUMENTS

| | | | |
|---|---|---|---|
| 4,090,144 A * | 5/1978 | Jenik et al. ...................... 327/79 |
| 4,137,504 A * | 1/1979 | Simmons ........................ 327/79 |
| 4,960,033 A | 10/1990 | Quantz | |
| 5,182,476 A * | 1/1993 | Hanna et al. ................... 327/362 |
| 5,359,652 A * | 10/1994 | Mulder et al. ................ 379/386 |
| 5,536,980 A | 7/1996 | Kawate et al. | |
| 5,623,220 A * | 4/1997 | Betti et al. ...................... 327/79 |
| 5,793,230 A | 8/1998 | Chu et al. | |
| 5,798,664 A * | 8/1998 | Nagahori et al. ............. 327/307 |
| 5,838,197 A * | 11/1998 | Tsukuda ........................ 330/252 |
| 6,211,716 B1 | 4/2001 | Nguyen et al. | |
| 6,288,458 B1 | 9/2001 | Berndt | |
| 6,288,604 B1 * | 9/2001 | Shih et al. .......................... 330/9 |
| 6,429,697 B1 | 8/2002 | Amazeen et al. | |

(Continued)

OTHER PUBLICATIONS

Naquisha Causey, "Design Document for Smart Dishwasher Controller," Mississippi State University Departement of Electrical and Computer Engineering, 22 pages, Oct. 22, 2001. ECE 4512. WINC's Smart Controller.

(Continued)

*Primary Examiner* — William Hernandez
(74) *Attorney, Agent, or Firm* — Seager Tufte & Wickhem LLC

(57) ABSTRACT

Systems and methods of actively compensating for the input offset voltage of a comparator are provided. A compensation circuit may include a compensation comparator for comparing the comparison signal generated using the output signal of a comparator, to a reference voltage. A first voltage accumulator is coupled to the compensation comparator and produces a first voltage that is related to a first amount of time that the comparison signal spends above the reference voltage. A second voltage accumulator is coupled to the compensation comparator, and produces a second voltage that is related to the second amount of time that the comparison signal spends below the reference voltage. The first voltage and/or the second voltage may be used to provide one or more compensation signals to one or more of the two input terminals of the comparator.

20 Claims, 14 Drawing Sheets

(56) References Cited

U.S. PATENT DOCUMENTS

| | | |
|---|---|---|
| 6,690,225 B2 | 2/2004 | Kondo et al. |
| 6,819,172 B2* | 11/2004 | Abidin et al. .................. 330/85 |
| 6,903,593 B2 | 6/2005 | Wang |
| 7,400,279 B2* | 7/2008 | Krymski ........................ 341/118 |
| 7,411,446 B2* | 8/2008 | Kao ................................. 330/9 |
| 7,532,065 B2* | 5/2009 | Chen et al. ........................ 330/9 |
| 7,593,212 B1 | 9/2009 | Toth |
| 7,612,600 B2* | 11/2009 | Liu et al. ....................... 327/307 |
| 7,622,988 B2 | 11/2009 | Denison et al. |
| 7,728,564 B2 | 6/2010 | Fricke et al. |
| 7,764,215 B2* | 7/2010 | Wan et al. ..................... 341/163 |
| 7,782,137 B2* | 8/2010 | Tanaka ......................... 330/259 |
| 8,030,991 B2 | 10/2011 | Cha et al. |
| 8,305,131 B2* | 11/2012 | Lee .............................. 327/337 |
| 2008/0157749 A1* | 7/2008 | Oung ......................... 324/76.12 |

OTHER PUBLICATIONS

Honeywell, "Power Stealing Thermostats," Honeywell Inc. 6 pages, Downloaded Aug. 1, 2012. 50-8433.

* cited by examiner

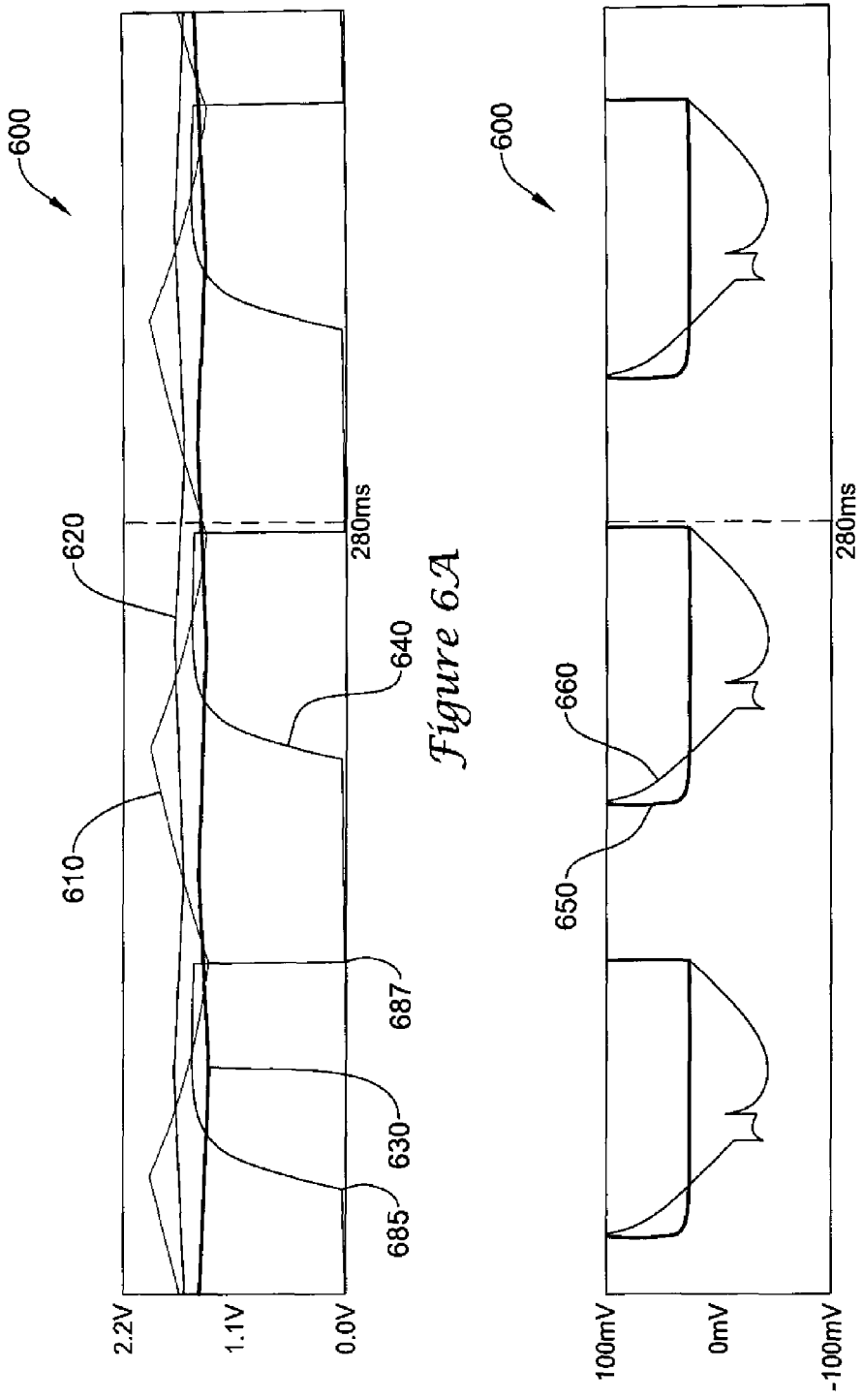

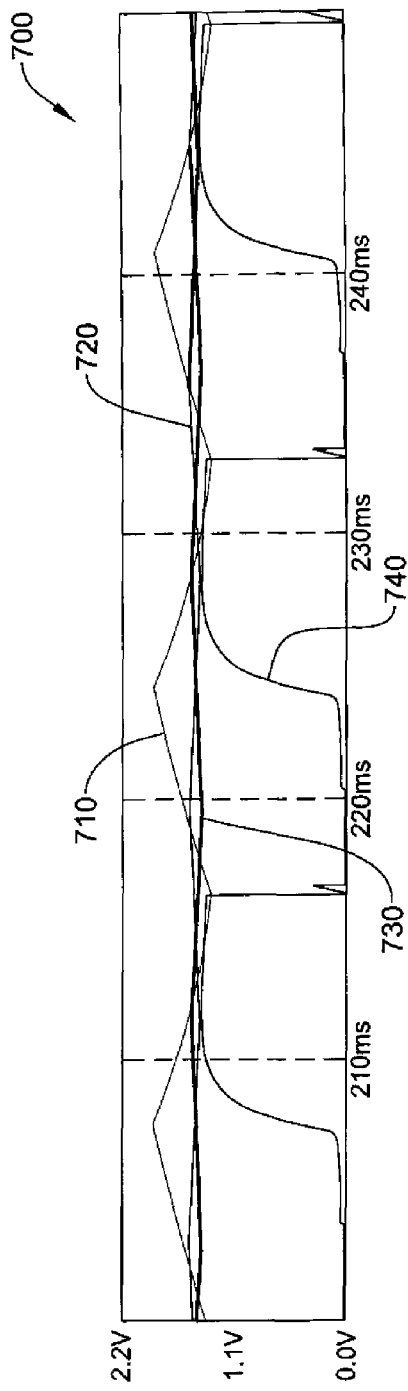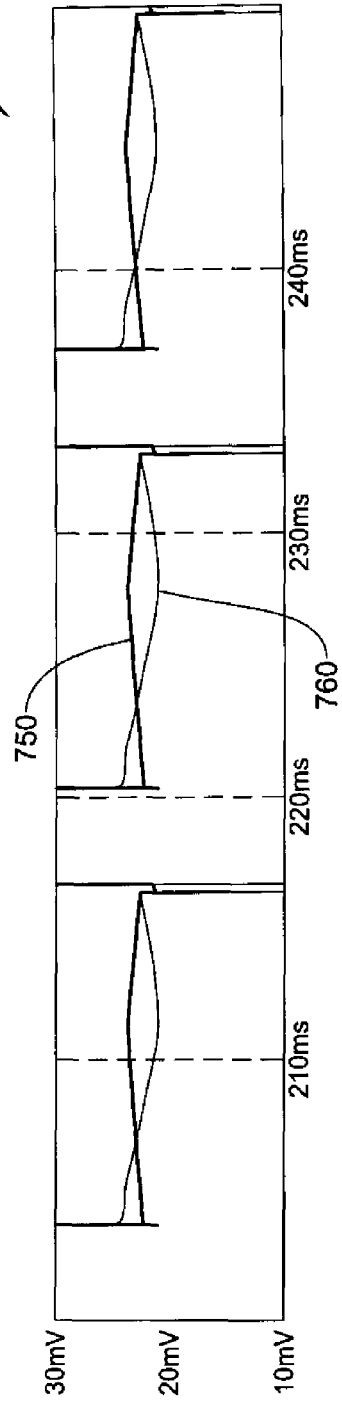
Figure 7A
Figure 7B

SYSTEMS AND METHODS FOR COMPENSATING THE INPUT OFFSET VOLTAGE OF A COMPARATOR

This is a continuation of co-pending U.S. patent application Ser. No. 13/420,274, filed Mar. 14, 2012 and entitled "SYSTEMS AND METHODS FOR COMPENSATING THE INPUT OFFSET VOLTAGE OF A COMPARATOR", which is incorporated herein by reference.

TECHNICAL FIELD

The present disclosure relates generally to comparators, and more specifically to systems and methods of compensating the input offset voltage of a comparator.

BACKGROUND

Comparators are used in a wide variety of circuits. All comparators and operational amplifiers have an input offset voltage that reduces the accuracy of the comparator and/or operational amplifier. This can be problematic, especially when the difference between the signals to be compared is expected to be small. In fact, when the difference between the input signals to be compared is on the order of the input offset voltage of the comparator, the signal-to-noise ratio at the output of the comparator may approach one or more, effectively drowning out the signal of interest.

In some cases, a compensation voltage may be applied to the comparator to help compensate for the input offset voltage of the comparator. This is relatively straight forward when the input offset voltage is a static quantity and known. However, the input offset voltage of a comparator can vary between individual units and can vary with operating parameters, such as operating temperature, operating voltage and/or time. This can make it difficult to provide a compensation voltage that can effectively cancel out the input offset voltage for all comparators over time and over all expected operating conditions. This is particularly true when the difference between the input signals to be compared is small. What would be desirable is a system and method for actively compensating for the input offset voltage of a comparator.

SUMMARY

The present disclosure relates generally to comparators, and more specifically to systems and methods of actively compensating for an input offset voltage of a comparator. In one example, a compensation circuit may be provided for compensating the input offset voltage of a comparator. The comparator may includes two input terminals and an output terminal, and may compare two input signals received at the two input terminals and produces a corresponding output signal at the output terminal. The comparator has an input offset voltage, which can vary with temperature, voltage, time and/or any other parameter. In some cases, the input offset voltage may vary between individual comparators. For example, the input offset voltage of a first comparator may differ from the input offset voltage of a second comparator, however the input offset voltages of the first comparator and the second comparator may still be within a specified range.

In some cases, a compensation circuit is provided to help compensate for the input offset voltage of the comparator. The compensation circuit may include a compensation comparator for comparing the synchronizing signal generated by the comparator to a reference voltage, wherein the synchronizing signal spends a first amount of time above the reference voltage and a second amount of time below the reference voltage. A first voltage accumulator may be coupled to the compensation comparator, and may produce a first voltage that is related to the first amount of time that the synchronizing signal spends above the reference voltage. A second voltage accumulator may be coupled to the compensation comparator, and may produce a second voltage that is related to the second amount of time that the synchronizing signal spends below the reference voltage. The first voltage and/or the second voltage may be used to provide one or more compensation signals to one or more of the two input terminals of the comparator In some embodiments, the compensation comparator may be used as part of a system to compensate the input offset voltage of a zero crossing detection circuit for a power stealing circuit, such as a power stealing circuit for a controller (e.g., a thermostat). The system may be configured to receive power using an input configured to connect to an AC power source that provides power to a load, such as an AC line voltage or an AC power signal from another power supply. In some cases, a zero crossing detection circuit connected to the input may be configured to determine a zero crossing of the AC input signal provided by the AC power source, where the zero crossing may be used to trigger a switch to temporarily divert current provided by the incoming AC power source to a power stealing circuit.

In some cases, the zero crossing detection circuit may include a comparator to compare an AC power signal from the AC power source to a reference (e.g., about zero volts or electrical ground). To help compensate for the input offset voltage, a compensation circuit may be provided. As described above, the compensation circuit may receive a signal corresponding to the zero crossing of the AC power signal received from the zero crossing detection circuit and may be configured to provide a first compensation signal to an inverting input of the comparator of the zero crossing detection circuit, and a second compensation signal to a non-inverting input of the comparator of the zero crossing detection circuit, wherein the first compensation signal moves in a direction opposite to the direction of the second compensation signal.

The preceding summary is provided to facilitate an understanding of some of the innovative features unique to the present disclosure and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following detailed description of various embodiments in connection with the accompanying drawings, in which:

FIGS. 6A-6E are graphs showing illustrative waveforms for the schematic diagrams of FIGS. 4-5, when only circuit power is delivered to the load and with the input offset V3 of FIG. 4 set to zero;

FIGS. 7A-7E are graphs showing illustrative waveforms for the schematic diagram of FIGS. 4-5, when full power is delivered to the load and with the input offset V3 of FIG. 4 set to zero.

Figure 1:
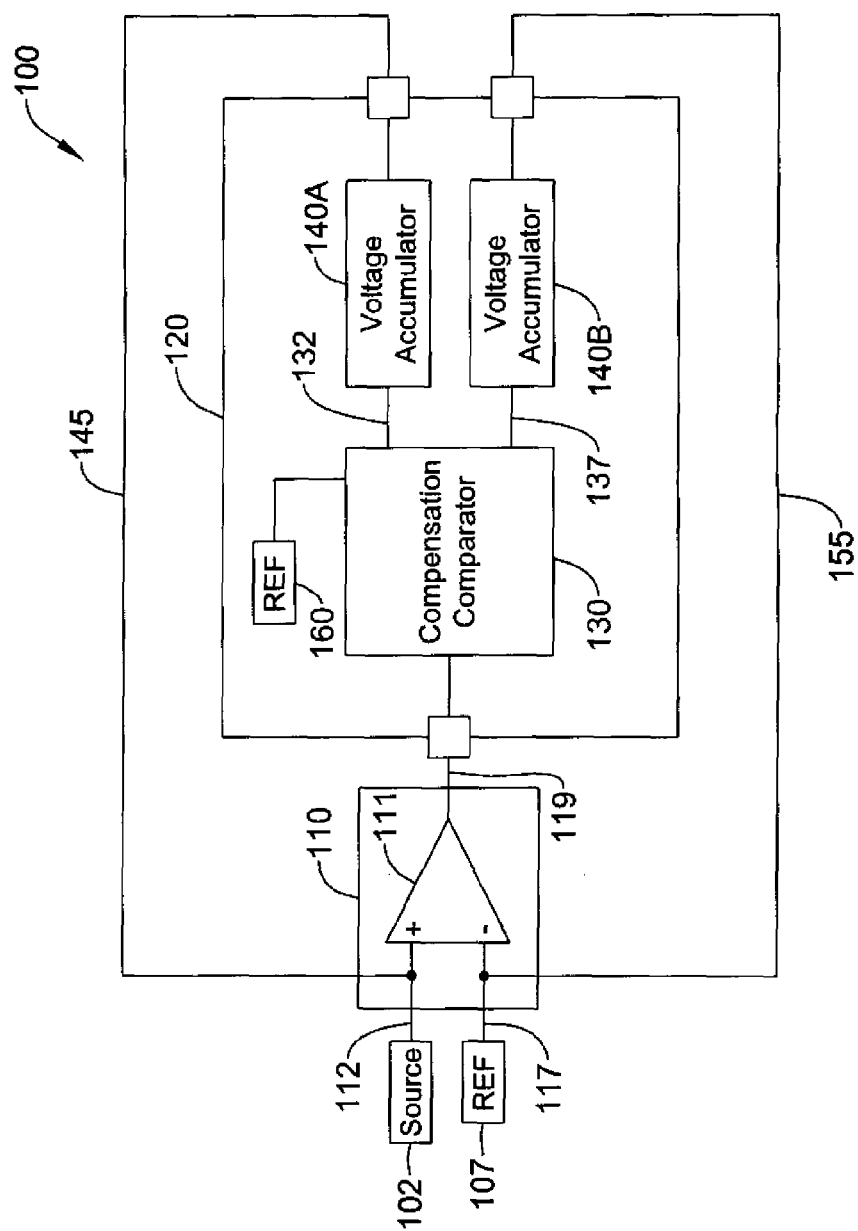
FIG. 1 is a block diagram of an illustrative signal comparison system having an input offset compensation circuit.

While the disclosure is amenable to various modifications and alternative forms, specifics thereof have been shown by way of example in the drawings and will be described in detail. It should be understood, however, that the intention is not to limit aspects of the subject matter of the disclosure to the particular embodiments described. On the contrary, the intention is to cover all modifications, equivalents, and alternatives falling within the spirit and scope of the disclosure.

DESCRIPTION

The following description should be read with reference to the drawings wherein like reference numerals indicate like elements throughout the several views. The detailed description and drawings show several embodiments which are meant to illustrative of the claimed in the disclosure.

FIG. 1 is a block diagram of an illustrative signal comparison system 100 having an input offset compensation circuit 120. In the example shown, the system 100 may include a comparison circuit 110 configured to compare a signal from an AC signal source 102 to a reference source 107. The comparison circuit 110 may be used, for example, to detect a zero crossing of an AC signal source 102. An output of the comparison circuit 110 (e.g., comparator 111) may be provided to an input offset compensation circuit 120. The compensation circuit 120 may be configured to provide at least one compensation signal to an input of the comparison circuit 110 for compensating an input offset voltage of one or more components of the comparison circuit 110. To provide the at least one compensation signal, the compensation circuit 120 may include, for example, a compensation comparator 130 and one or more voltage accumulators 140A, 140B.

In some embodiments, a comparison circuit 110 may be configured to compare the source signal 112 received from the AC signal source 102 to a reference signal 117 received from a reference source 107. In some embodiments, the signal source may be an AC power source, such as a power supply of a building or other structure. For example, the AC signal source 102 may be a line voltage and/or line current supply of a building, or may be another power supply capable of providing an alternating signal. In some cases, the line voltage may be 120/240 volts 50/60 HZ AC, 24 volt 50/60 HZ AC, or a voltage at another magnitude and/or frequency. In some cases, the AC signal source 102 and/or the reference source 107 may be a power source capable of providing a voltage and/or current signal with a waveform shape having a specified magnitude and/or a specified frequency. In one example, the AC signal source 102 may be capable of providing a sinusoidal waveform, a square waveform, a triangular waveform, or another alternating waveform shape. The reference source 107 may be connected to a second terminal of the AC signal source 102 (e.g. a differential AC source), or may be tied to a ground and/or neutral connection for the electrical system of a building, such as a ground or neutral connection for a single phase or three phase AC power line.

The reference source 107 may be capable of providing a signal of a constant magnitude (e.g., a DC signal source), an alternating magnitude (e.g., an AC signal source), or other waveform shape, depending on the application.

In some embodiments, the comparison circuit 110 may include one or more integrated circuits (e.g., comparators, operational amplifiers, etc.) and/or discrete components (e.g., resistors, capacitors, transistors, inductors etc.) to provide a synchronizing signal 119 indicative of a differential between the source signal 112 and the reference signal 117. In some cases, the synchronizing signal 119 from the comparison circuit 110 can be an alternating signal corresponding to when the source signal 112 lies above and/or below the reference signal 117. For example, in a zero crossing detector application, the comparison signal 119 may be substantially a square wave having a first magnitude (e.g., about 1.5 V, about 3 V, etc.) when the source signal 112 is greater than zero volts (e.g., electrical ground), and a second magnitude (e.g., about 0 V) when the source signal 112 is less than zero volts. Conversely, the synchronizing signal 119 may have a non-zero magnitude when the source signal 112 is less than zero and a zero magnitude when the source signal 112 is greater than zero. In some cases, both the first magnitude and the second magnitude of the synchronizing signal may be non-zero.

The components of the comparison circuit 110 may not be ideal devices such that internal losses may influence the comparison. For example, comparators often draw currents for biasing internal transistors such that the voltage drop across internal resistances result in an input offset voltage. For input signals much larger than the input offset voltage, the effects of the input offset voltage can be negligible. However, when the magnitude of the input signal is approximately the magnitude of the input offset voltage, the effects of the input offset voltage can substantially interfere with the performance of the comparison circuit 110. The compensation circuit 120 can be used to help compensate for an input offset voltage by using one or more output signals from the comparison circuit 110 to provide one or more compensation signals 145,155.

In some embodiments, the compensation circuit 120 can include a compensation comparator 130 to compare a comparison signal (e.g., the synchronizing signal 119, or a signal) generated using the synchronizing signal 119) to a reference signal from the reference source 160. The reference source 160 may be a signal source that is the same as or different than the reference source 107. For example, the reference source 160 may be a signal source capable of providing a DC reference signal, where the DC reference signal has a magnitude similar to that of the magnitude of the synchronizing signal 119. For example, the DC reference signal may be a reference threshold of about 1.5V. In some cases, the compensation circuit 120 may include components (e.g., resistors, capacitors, transistors, etc.) to offset the synchronizing signal 119. The comparison signal may be generated from the synchronizing signal 119 so that the duration that the comparison signal lies above the reference signal 160 is substantially similar to the duration that the comparison signal lies below the reference signal 160 as the AC signal source 102 oscillates relative to the reference source 107. In some cases, the compensation comparator 130 may include one or more components to provide at least one of a first signal 132 and a second signal 137, such that the first signal 132 corresponds to the time that the comparison signal lies above the reference signal, and/or the second signal 137 corresponds to the duration that the comparison signal 119 lies below the reference signal 160. For example, the compensation comparator 130 may include one or more comparators (e.g., one or more integrated circuits and/or discrete components) capable of comparing the comparison signal and/or the synchronizing signal 119 to the reference signal from the reference source 160.

In some cases, the first voltage accumulator 140A may be coupled to the compensation comparator 130 to receive the first signal 132 so that the first voltage accumulator 140A may produce a first voltage that is proportional to the first amount of time that the comparison signal and/or synchronizing signal 119 generated by the comparison circuit 110 spends above the reference signal 160. Likewise, the second voltage accumulator 140B may be coupled to the compensation comparator 130 to receive the second signal 137 so that the second voltage accumulator 140B may produce a second voltage that is proportional to the second amount of time that the comparison signal and/or synchronizing signal 119 generated by the comparison circuit 110 spends below the reference signal 160. The voltage accumulator 140A and/or the voltage accumulator 140B may include one or more charge storage devices and/or components capable of storing energy, such as a capacitor, a battery or another electrical and/or mechanical component capable of accumulating a voltage.

In some embodiments, the voltage accumulators 140A/140B may include a capacitor capable of accumulating and discharging a voltage. For example, the voltage accumulator 140A may accumulate a voltage while the alternating signal (e.g., the first signal 132, the second signal, etc.) lies above the reference 160, and may discharge the accumulated voltage when the alternating signal lies below the reference 160. The accumulation and discharge cycle of the voltage stored by the voltage accumulator 140A may be used to generate and/or provide a first compensation signal 145 to one of the two input terminals of the comparison circuit 110, such as the terminal receiving the source signal 112. Likewise, the second voltage accumulator 140B may accumulate a voltage while the alternating signal (e.g., the first signal 132, the second signal, etc.) lies below the reference 160, and may discharge the accumulated voltage when the alternating signal lies above the reference 160. The accumulation and discharge cycle voltage accumulator 140B may be used to generate and/or provide a second compensation signal 155 to the other one of the two input terminals of the comparison circuit 110, such as the terminal receiving the reference signal 117.

In some cases, the first compensation signal 145 may be communicated to an input of the comparison circuit 110, such as the non-inverting input of the comparator 111, and/or the second compensation signal 155 may be communicated to a second input of the comparison circuit 110, such as the inverting input of the comparator 111. The first compensation signal 145 may move in a first direction and the second compensation signal 155 may move in a second direction. The first compensation signal 145 and/or the second compensation signal 155 may apply a bias to the inputs of the comparison circuit 110 that encourages the comparison signal 119 to generate a comparison signal that spend an equal amount of time above and below the reference 160, and thus may actively compensate for any parasitic input offset voltage of the comparison circuit 110.

Figure 2:
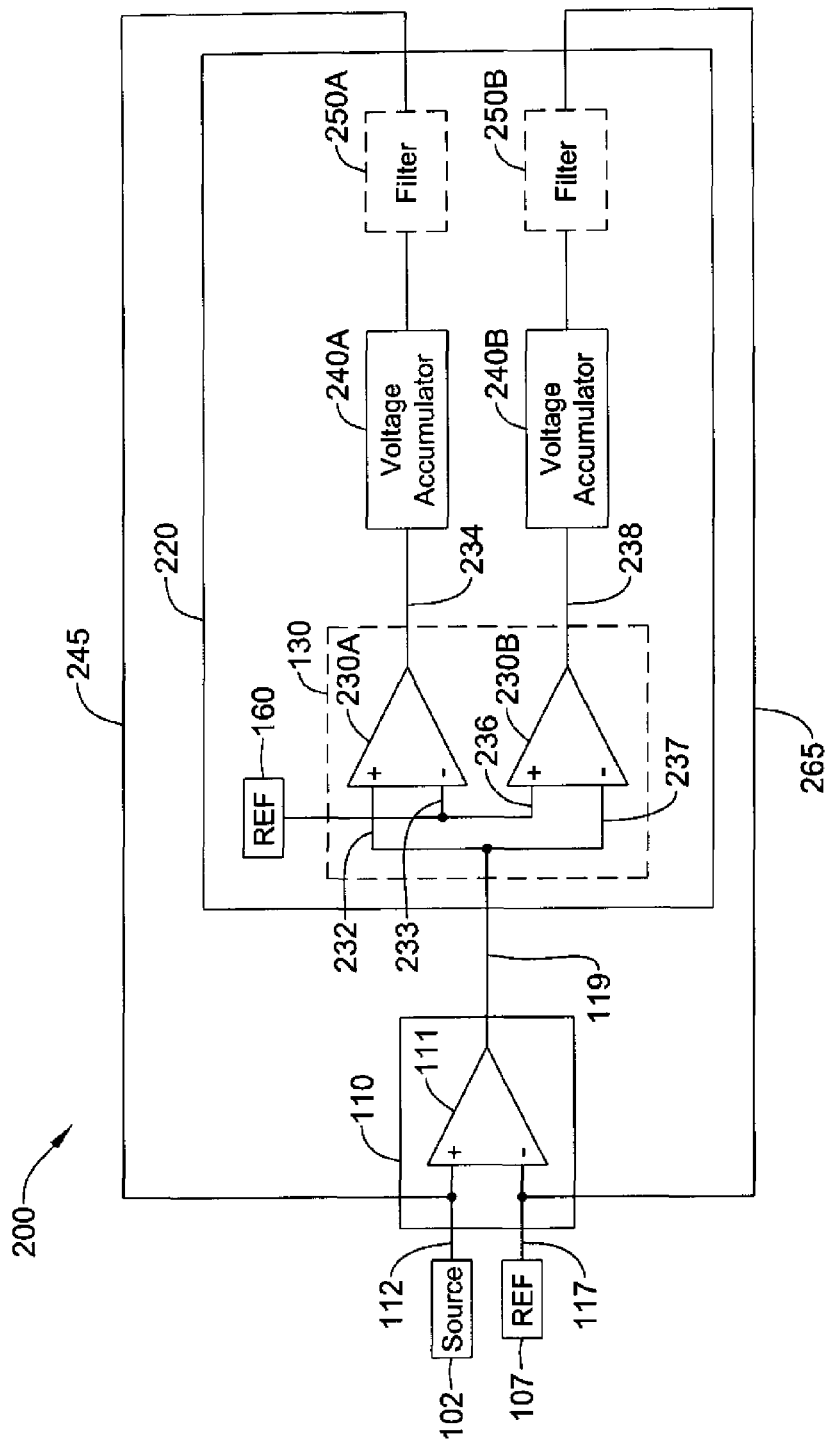
FIG. 2 is a block diagram of another illustrative signal comparison system having an input offset compensation circuit.

FIG. 2 is a block diagram of an illustrative signal comparison system 200 having an input offset compensation circuit 220. As described above with reference to FIG. 1, a source signal 112 may be compared to the reference signal 117 using the comparison circuit 110 to provide a synchronizing signal 119. In some cases, a differential AC source signal may be provided to both inputs 112 and 117 of the comparison circuit 110. In any case, the resulting synchronizing signal 119 may be provided to a compensation circuit 220 to compensate for the input offset voltage of the comparator 111 of the comparison circuit 110. The compensation circuit 220 may include a compensation comparator 130 having two or more comparators 230A, 230B. The compensation circuit 220 may also include two or more voltage accumulators 240A, 240B. Optionally, the compensation circuit 220 may include one or more filters 250A, 250B coupled to the voltage accumulators 140A, 140B.

In some embodiments, the source signal 112 may be compared to a reference signal 117 by the comparison circuit 110 to provide the synchronizing signal 119. As shown in FIG. 2, the AC signal source 102 may be connected to a non-inverting input of the comparator 111, and the reference source 107 may be connected to the inverting input of the comparator 111. Alternatively, the AC signal source 102 may be connected to the inverting input of the comparator 111, and the reference source 107 may be connected to the non-inverting input of the comparator 111. In some cases, the comparison signal may be generated using the synchronizing signal 119.

In the example of FIG. 2, the comparison signal or the synchronizing signal 119 may be provided to a non-inverting input 232 of the comparator 230A, and the reference signal 160 may be provided to an inverting input 233 of the comparator 230A. The comparator 230A may provide an output signal 234. The output signal 234 may correspond to the time the comparison signal spends above the reference signal 160. The comparison signal or the synchronizing signal 119 may also be provided to an inverting input 237 of the comparator 230B, and the reference signal 160 may be provided to the non-inverting input 236 of the comparator 230B. The comparator 230B may provide an output signal 238. The output signal 238 may correspond to the time the comparison signal 119 spends below the reference signal 160. In some cases, the output signal 236 may move in a direction opposite to that of the output signal 238.

The first voltage accumulator 240A may be coupled to the first comparator 230A of the compensation comparator 230 to receive the first output signal 234 so that the first voltage accumulator 240A may produce a first voltage that is proportional or otherwise related to the first amount of time that the synchronizing signal 119 generated by the comparison circuit 110 spends above the reference signal 160. Likewise, the second voltage accumulator 240B may be coupled to the compensation comparator 230 to receive the second output signal 238 so that the second voltage accumulator 240B may produce a second voltage that is proportional to the second amount of time that the synchronizing signal 119 generated by the comparison circuit 110 spends below the reference signal 160. The first voltage of the first voltage accumulator 240A may be used to provide a first compensation signal 245 to one of the two input terminals of the comparison circuit 110, such as the terminal receiving the source signal 112. In some cases, the second voltage of the second voltage accumulator 240B may be used to provide a second compensation signal 255 to the other one of the two input terminals of the comparison circuit 110, such as the terminal receiving the reference signal 117.

In some instances, the compensation circuit 220 may include one or more filters 250A, 250B configured to filter electrical noise and/or other extraneous signals that may be coupled into the output signals 234, 238 provided by the voltage accumulators 240A, 240B. For example, the filter 250A, 250B may be implemented as a combination of integrated or discrete elements, such as a resistor and a capacitor configured as a series RC network (e.g., a low-pass filter). Although a first order low-pass filter may be used, it is contemplated that any combination of analog or digital filters can be used, including one or more high pass filters, low pass filters, band pass filters, notch filters, passive filters (e.g., having "T" sections, "π" sections, etc.), active filters (e.g., Chebyshev filter, Butterworth filter, etc.), IIR filters, FIR filters, and/or any other suitable filter or filter combination.

Figure 3:
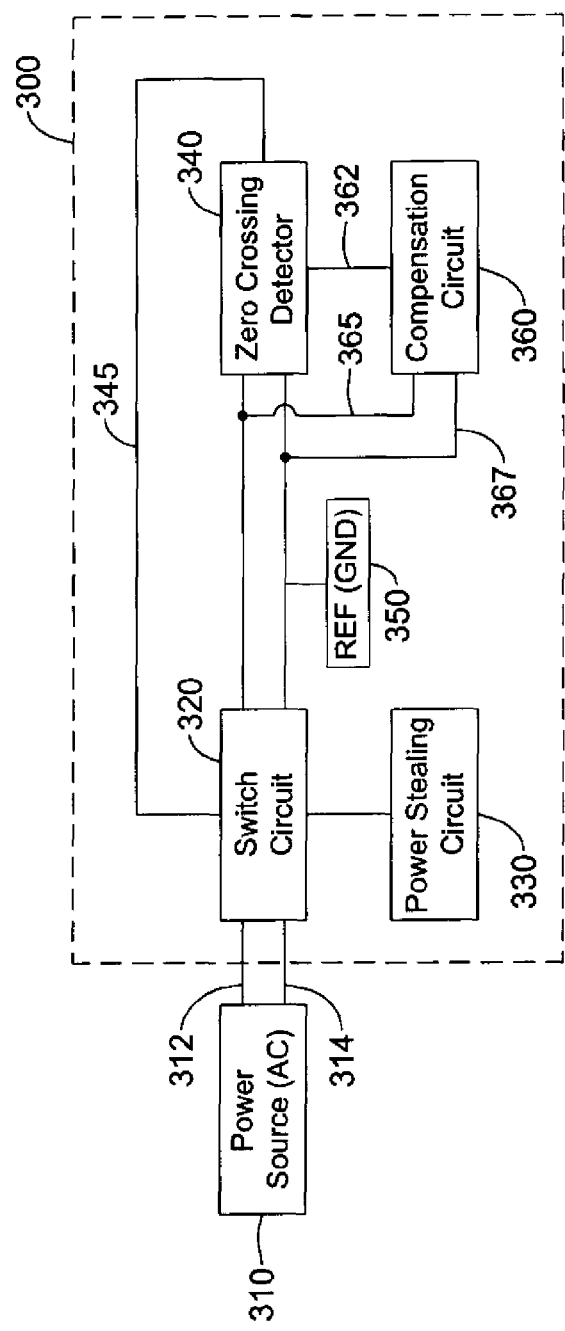
FIG. 3 is a block diagram of an illustrative power stealing block including an input offset voltage compensation circuit.

FIG. 3 is a block diagram of an illustrative power stealing block 300 including an input offset voltage compensation circuit. In some embodiments, the illustrative power stealing block 300 may be implemented within an electronic device, such as an electronic controller (e.g., a building controller, a thermostat, a process controller, a programmable logic controller, etc.) that steals power from an electronic signal used to power a load (e.g. compressor, heating element, motor, fan, etc.), but this is not required. In one example, the power stealing block 300 can be incorporated into a thermostat or other building control devices, and can steal and then provide power to control circuitry of the thermostat.

A power source 310 may be used to provide power to power stealing block 300. The power stealing block 300 may include a switch circuit 320 that may be used to intermittently provide power to a power stealing circuit 330. To facilitate the activation of the switch circuit 320 near a zero crossing of the AC power signal provided by AC power source 310, the power stealing block 300 may include a zero crossing detector 340. The zero crossing detector 340 may be configured to determine a zero crossing of the AC signal received from the power source 310 by, for example, comparing one line of the incoming AC signal to the other line used as a reference source 350. A compensation circuit 360, similar to the compensation circuits 120, 220 shown in FIGS. 1 and 2, may be included in the power stealing block 300 to help compensate the zero crossing detector 340 for any input offset voltage.

In some embodiments, the AC signal supplied by the power source 310 may be monitored for a zero crossing by the zero crossing detector 340. The power source 310 may include at least two terminals 312, 314. The first terminal 312 of the power source 310 may be connected to a first input of the zero crossing detector 340, and the second terminal 314 may be connected to a second input of the zero crossing detector 340. The second terminal 314 and/or the second input of the zero crossing detector 340 may be connected to electrical ground, but this is not required. In some cases, the AC signal may be a differential AC signal that is supplied between terminals 312 and 314.

The zero crossing detector 340 may be configured to output a zero crossing signal 345 corresponding to a zero crossing of the AC signal provided by the power source 310. In some cases, the zero crossing signal 345 may be a pulse that is initiated at the zero crossing. In some examples, the zero crossing signal 345 may be provided to the switch circuit 320 to activate the electronic and/or mechanical switches to divert power to the power stealing circuit 330, while minimizing switching losses and/or reducing Electromagnetic Interference (EMI) that might otherwise occur if the switching were to occur at, for example, peak voltages of the AC signal.

In some cases, the power source 310 may be directly connected to the zero crossing detector 340, or the power source 310 may be connected to the zero crossing detector 340 via the switch circuit 320 and/or other components (e.g., resistors, capacitors, inductors, etc.) that may be configured to provide signal conditioning to the AC signal. The switch circuit 320 and/or signal conditioning components may be configured such that the zero crossing detector 340 receives the AC signal via a circuit having a low impedance. In such cases, when the AC signal has a small amplitude, such as an amplitude approximating the magnitude of the input offset voltage (e.g., from about 1 millivolt to about 20 millivolts), a comparator of the zero crossing detector 340 (e.g., the comparator 111 of FIGS. 1 and 2) may fail to detect a zero crossing due to a parasitic input offset voltage of the comparator 111. To compensate for the input offset voltage, a compensation circuit 360 may receive an alternating synchronizing signal 362 from the zero crossing detector 340, such that the alternating synchronizing signal 362 may correspond to a duration that the AC signal spends above a reference 350 and/or a duration that the AC signal spends below the reference 350, as further described above with respect to FIGS. 1 and 2. In some cases, the compensation circuit 360 can provide a first alternating compensation signal 365 to the first input of the zero crossing detector 340, and a second alternating compensation signal 367 to the second input of the zero crossing detector 340. The first alternating compensation signal 365 and the second alternating compensation signal 367 can be used to compensate for the input offset voltage of the zero crossing detector 340.

Figure 4:
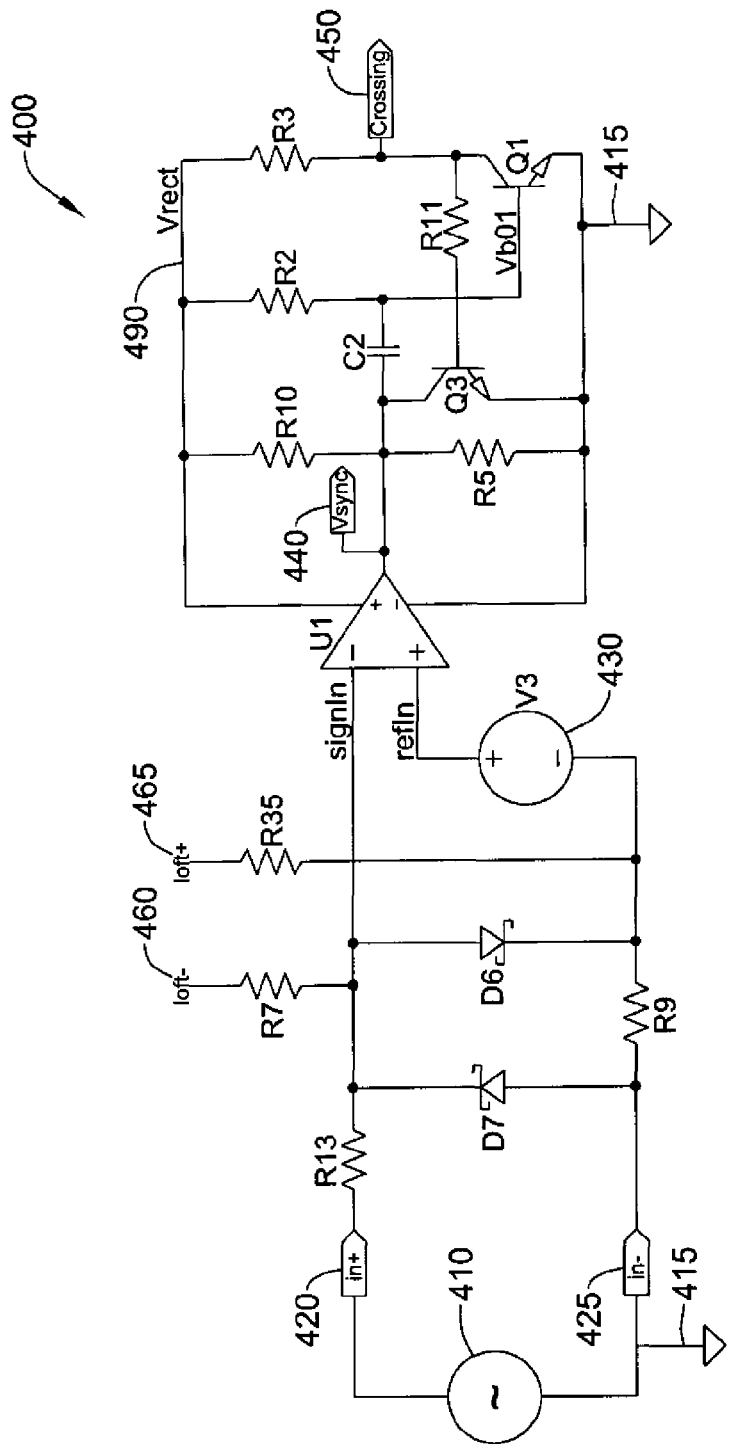
FIG. 4 is a schematic diagram of an illustrative zero crossing detection circuit.

FIG. 4 is a schematic diagram of an illustrative zero crossing detection circuit 400, such as the comparison circuit 110 of FIGS. 1 and 2 or the zero crossing detector 340 of FIG. 3. In this example, the zero crossing detection circuit 400 may be used to simulate the operation of the zero crossing detection circuit 400 using simulation software (e.g., PSPICE, Matlab/Simulink, etc.). This zero crossing detection circuit 400 is merely illustrative and is not meant to be limiting in any manner.

In the illustrative embodiment, a signal source 410 (e.g., a signal generated by current going through an impedance path) and/or a reference source (e.g., the ground connection 415) may be connected to one or more input terminals 420, 425 of the zero crossing detection circuit 400, such that the zero crossing detection circuit 400 may determine when a signal provided by the signal source 410 crosses zero (e.g., electrical ground 415). The signal source 410 may provide an AC voltage signal (e.g., 120 V, 15 mV, etc.), an AC current signal (e.g., 20 mA), or both. In some cases, it may be desirable to limit the magnitude of the AC signal provided by the signal source 410. In such cases, a voltage regulator and/or clipper circuit may be provided. For example, one or more resistors (e.g., resistor R9, resistor R13) may be placed in series with the voltage source 410, and one or more diodes (e.g., Schottky diode D6, D7, a zener diode, etc.) may be placed in parallel with the voltage source 410. For AC circuits, the diodes D6 and D7 may be placed in an anti-parallel arrangement to limit one or more of the positive half-wave and/or negative half-waves of the AC source 410.

In some cases, the AC source 410 and/or reference source may be connected to an inverting input and a non-inverting input of a comparator U1. In some simulation models, the comparator U1 may be modeled as an ideal comparator, and the input offset voltage of a non-ideal comparator may be modeled using a DC voltage source V3. Typically, the input offset voltage of a comparator is relatively small (e.g., from around 1 millivolt to around 15 millivolts).

In this illustrative example, the comparator U1 compares the AC source signal provided by the AC source 410 to the electrical ground 415, resulting in a synchronizing signal Vsync 440 that corresponding to the duration that the AC source signal spends above the electrical ground 415 and/or the time the AC source signal spends below the electrical ground 415. In some cases, the zero crossing detection circuit 400 may include two or more inputs 460, 465 to receive compensation signals, such as from the compensation circuit 500 of FIG. 5, to help compensate for the input offset voltage V3. In one example, the first compensation signal received at the first input 460 may be supplied to the inverting input of the comparator U1 through a resistor R7. Likewise, the second compensation signal received at the second input 465 may be supplied to the non-inverting input of the comparator U1 through a resistor R35. The zero crossing detection circuit 400 may be configured to detect a transition of the AC signal waveform, such as a rising edge (e.g., the transition from negative to positive) or a falling edge (e.g., the transition from positive to negative).

To detect the rising and/or falling edge of the AC signal waveform, the zero crossing detector may include one or more integrated or discrete components arranged to generate a pulse signal (e.g., the crossing signal 450) when the desired edge is detected. For example, the zero crossing detection circuit 400 may be provided a DC voltage (e.g., Vrect) to be used as a reference voltage. The DC voltage Vrect may be provided to a voltage divider (e.g., resistors R5 and R10), such that the capacitor C2 can accumulate an electrical charge. In some examples, the zero crossing pulse signal (e.g., the signal crossing 450) may be generated using any number of integrated or discrete components (e.g., resistors, capacitors, transistors, digital logic circuits such as AND gates, OR gates, etc.). In the illustrative example of FIG. 4, the zero crossing pulse signal 450 may be generated using discrete components, such as the resistors R2, R3, R5, R10 and R11, the capacitor C2, and transistors Q1 and Q3.

In the example shown, a pulse can be generated when the voltage across the capacitor C2 biases the transistor Q1 such that current stops flowing through Q1 thus generating the rising edge of the zero crossing pulse. This pulse may, in turn, be used to activate the transistor Q3 to avoid noise from the synchronizing signal 440. Once capacitor C2 as recharges to its new value through resistor R2, current can start flowing through transistor Q1, thus generating the falling edge of the zero crossing pulse. While the transistors Q1 and Q3 are shown to be BJTs, other transistor types may be used, such as MOSFETs, JFETs, HEMTs, and the like.

Figure 5:
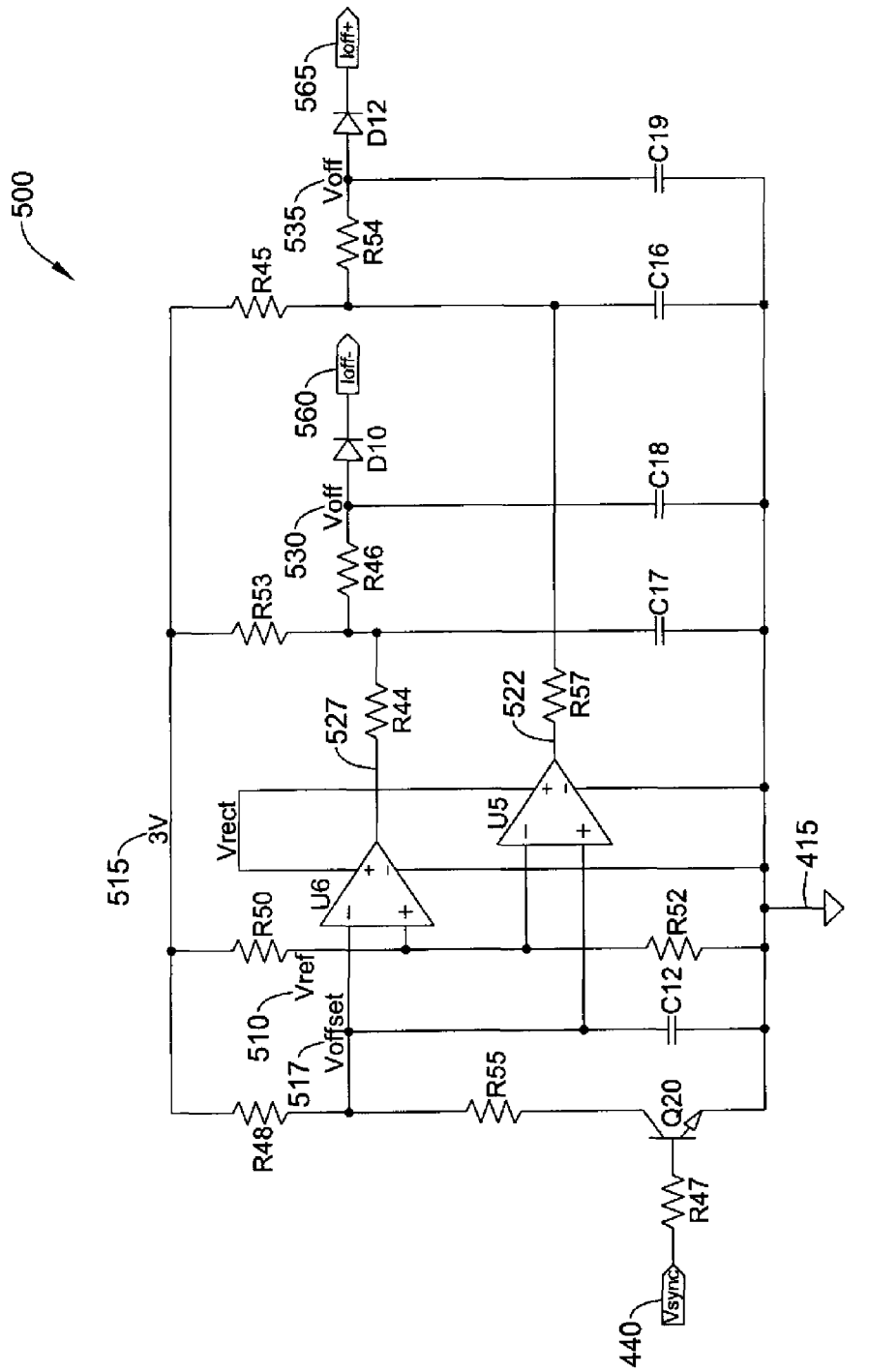
FIG. 5 is a schematic diagram of an illustrative input offset voltage compensation circuit.

FIG. 5 is a schematic diagram of an illustrative input offset voltage compensation circuit 500. The compensation circuit 500 of FIG. 5 may be used, for example, to simulate the compensation circuit 500 in combination with the zero crossing detection circuit 400 of FIG. 4 using simulation software (e.g., PSPICE, Matlab/Simulink, etc.). This compensation circuit 500 is merely illustrative and is not meant to be limiting in any manner.

As discussed above, the compensation circuit 500 may be used to compensate the input offset voltage of a comparator, such as comparator U1 of FIG. 4. In some embodiments, the compensation circuit 500 may include an input 440 configured to receive an alternating synchronizing signal from a comparison circuit, such as the synchronizing signal Vsync 440 of FIG. 4. The compensation circuit 500 may be configured to use the synchronizing signal Vsync 440 to charge or discharge a capacitor C12 generating a comparison signal Voffset 517 for comparison to a reference voltage (e.g., Vref 510). The comparison signal Voffset 517 may be compared to the reference voltage using one or more comparators (e.g., the comparators U5 and U6). One or more voltage dividers may be used to generate the threshold reference voltage Vref 510. A voltage accumulator is used to generate comparison signal Voffset 517, such that the duration that the signal Vsync 440 is high is substantially similar to the duration that Vsync 440 is low. In such cases, the resistors R48, R50, R52 and R55 may be sized accordingly. For example, resistors R48 may have a resistance of about twice that of R55 for charging and discharging C12, while resistors R52 and R50 may have a resistance of about the same magnitude.

As described above, the compensation circuit 500 may be configured to generate one or more compensation signals (e.g., compensation signals Ioff− 560 and Ioff+ 565). The compensation signal Ioff+ 565 may be proportional or otherwise related to a first amount of time that the output signal of the comparator (e.g., Vsync 440) is high.

Similarly, the comparison signal Ioff− 560 may be proportional or otherwise related to the second amount of time that the output signal of the comparator is low. In generating the compensation signals Ioff+ 565 and/or Ioff− 560, the compensation circuit 500 may include one or more comparators, such as comparators U5 and U6. In the example shown, the comparison signal Voffset 517 is provided to the non-inverting input of comparator U5 and the inverting input of comparator U6. Similarly, the reference voltage Vref 510 may be supplied to the non-inverting input of U6 and to the inverting input of U5. As such, the comparator U5 may be configured to output a signal while the comparator U6 outputs a signal having a zero magnitude.

The comparators U5 and U6 may supply comparison signals, such as the comparison signals 522 and 527, to one or more voltage accumulators. In the example shown, the compensation circuit 500 may include a first voltage accumulator configured to receive the comparison signal 527 from U5, where the voltage accumulator includes one or more resistors R44, R53 and a capacitor C17. A second voltage accumulator may be configured to receive the comparison signal 522 from U6, where the second voltage accumulator includes at least one resistor R47, R57 and a capacitor C16. As discussed above, the capacitor C17 may be configured to accumulate a voltage that is proportional or otherwise related to the duration that the comparison signal Voffset 517 spends below the reference threshold. Similarly, capacitor C16 may be configured to accumulate a voltage proportional to the duration that the comparison signal Voffset 517 spends above the reference threshold. The voltage stored in capacitor C17 may be used to provide the compensation signal Ioff− 560, and the voltage stored in capacitor C16 may be used to provide the compensation signal Ioff+ 565.

In some examples, the compensation circuit 500 may include one or more filters for filtering the compensation signal (e.g., the compensation signals Ioff− 560 and Ioff+ 565). In the illustrative example, the filters may include a low-pass filter having an RC network, such as resistor R46 and capacitor C18, or resistor R54 and capacitor C19. The compensation circuit 500 may also include diodes (e.g., diodes D10 and D12) to help protect the compensation circuit 500, and to help ensure that current flows from the compensation circuit 500 to the zero crossing detection circuit 400.

FIGS. 6A-6E are graphs showing illustrative waveforms for the schematic diagram of FIGS. 4-5, when only circuit power is delivered to the load and with the input offset V3 of FIG. 4 set to zero. FIGS. 6A-6E correspond to a system having a relay for supplying power to a load from the power source 410, where the relay is open and power is not being supplied to the load, but instead is being diverted to the power stealing block. Here, the signals may be representative of a simulation run of a system including the schematic diagrams of FIGS. 4 and 5, wherein the zero crossing detection circuit 400 is configured to detect a zero crossing of a signal from the signal source 410 and wherein the compensation circuit 500 is used to compensate for the input offset voltage 430 of the comparator U1 of FIG. 4.

Figure 6C:
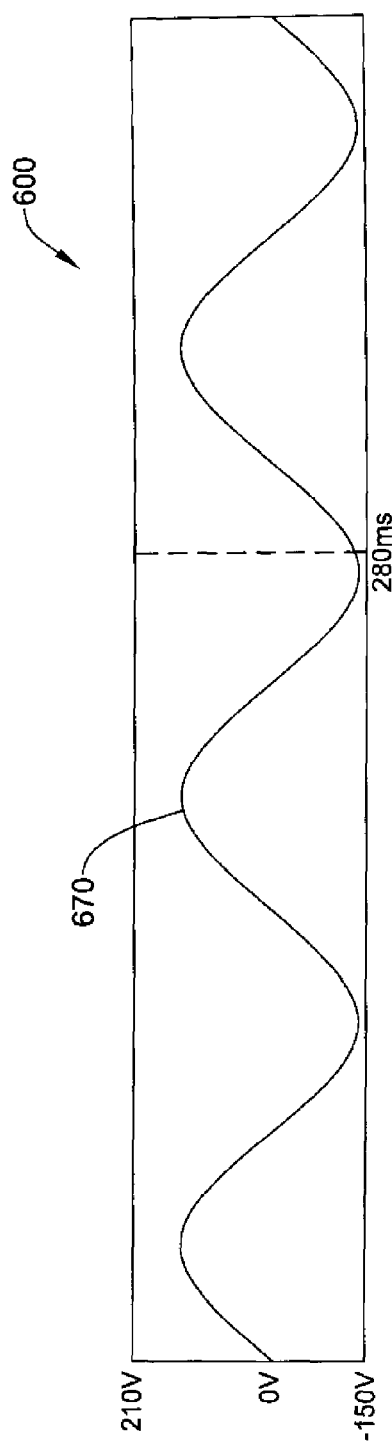
Figure 6D:
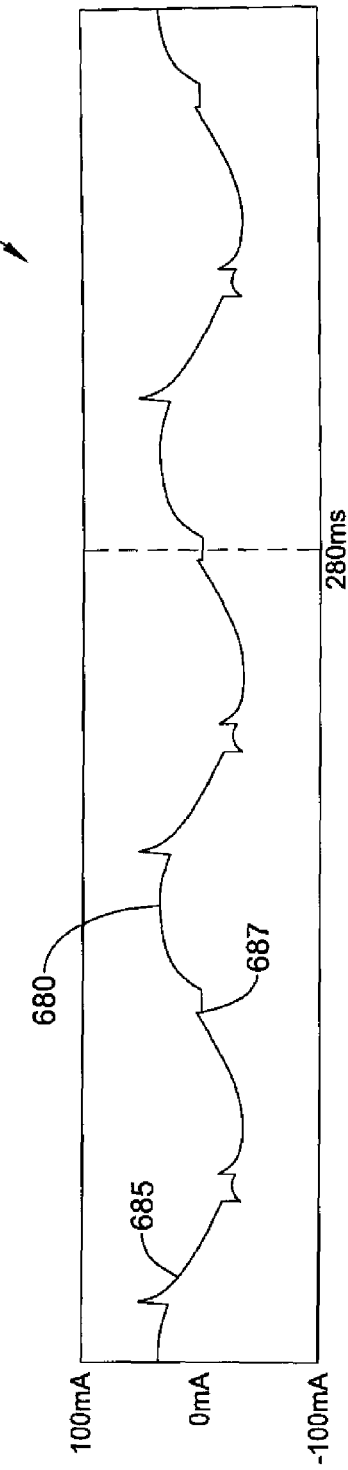
Figure 6E:
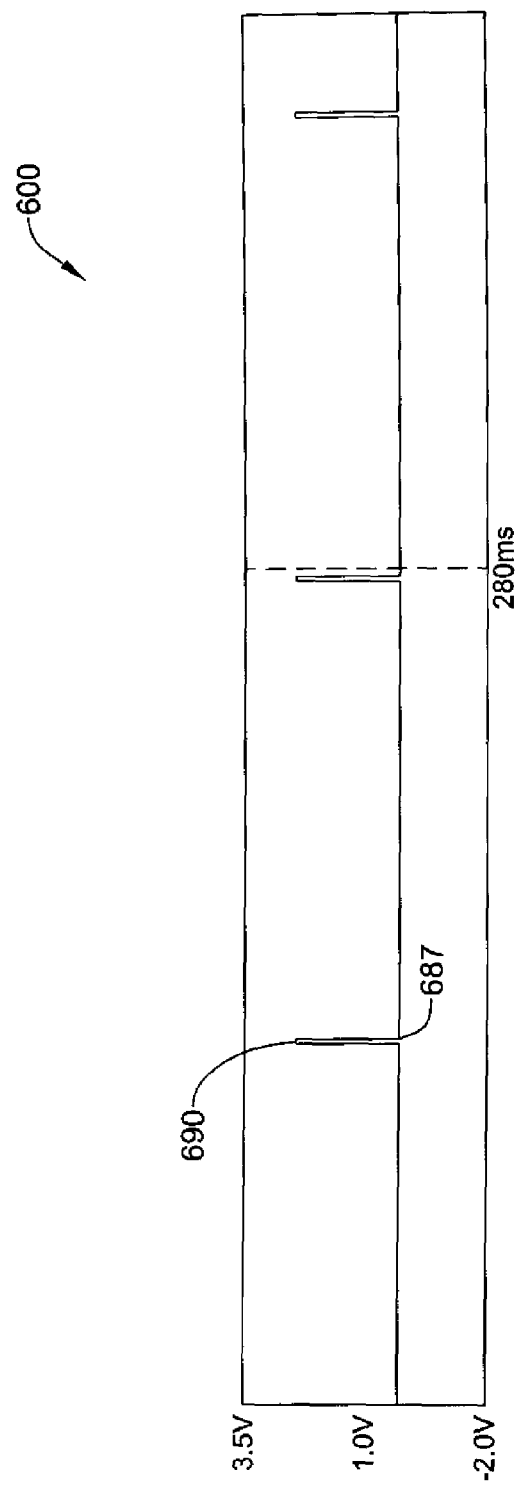

FIG. 6C depicts waveforms supplied from the power source 410. For example, the power source 410 may supply an AC voltage waveform 670 of 120 V at 50/60 Hz. Similarly, FIG. 6D shows the current supplied from the power source 410, which when the load is not activated, is a generally sinusoidal current waveform 680 of about 30 mA at 50/60 Hz, 90 degrees out of phase with the voltage waveform 670. In some examples, the system of FIG. 3 may include one or more capacitors within the switch circuit 320. In such cases, the current may flow through the capacitor causing the phase differential between the voltage and current signals from the signal source 410.

FIG. 6B depicts the voltage waveforms at the inputs of the comparator U1 of FIG. 4. Over the specified time period, the voltage waveform Vsigin 660 at the inverting input of the comparator U1 corresponds to the negative half wave of the source current waveform 680 of FIG. 6D, where the magnitude is within the range from about 100 mV to about –40 mV. The signal at the non-inverting input of the comparator U1, signal Vrefin 650, corresponds to a roughly DC voltage of approximately 25 mV over the same negative half wave of the source current waveform 680 of FIG. 6D. When the comparator inputs Vsigin and Vrefin cross at approximately 20 mV, both signals go to a specified value (e.g., approximately half of the reference voltage Vrect of FIGS. 4 and 5) when the solid state device of the switch circuit 320, for example, are opened for power stealing. The comparator U1 can be configured to compare the Vsigin signal 660 to Vrefin signal 650. The comparison results in the comparison signal Vsync 640 shown in FIG. 6A, and may approximate a square wave where the rising edge corresponds to a falling edge zero crossing 685 of the input current waveform 680. The rising edge of the Vsync signal 640 corresponds to a rising edge zero crossing 687 of the input current waveform 680. As discussed above, the zero crossing detection circuit 400 can output a zero crossing pulse waveform 690, shown in FIG. 6E, such that the pulse corresponds to the rising edge zero crossing 687.

The compensation circuit 500 receives the Vsync signal 640 from the zero crossing detection circuit 400 and produces the Voffset waveform 610 using the transistor Q20 and the capacitor C12, as discussed above. The compensation circuit 500 may then compare the Voffset waveform 610 to the reference voltage Vref 510 using the comparators U5, U6 and the voltage accumulators of R33, R44, and C17, and R45, R57, and C16 to produce the Voff– waveform 630 and the Voff+ waveform 620. As can be seen, the Voff– waveform 630 and Voff+ waveform 620 are shown to be not exactly equal to compensate for the dissymmetry of the path to ground of the inputs.

Figure 7C:
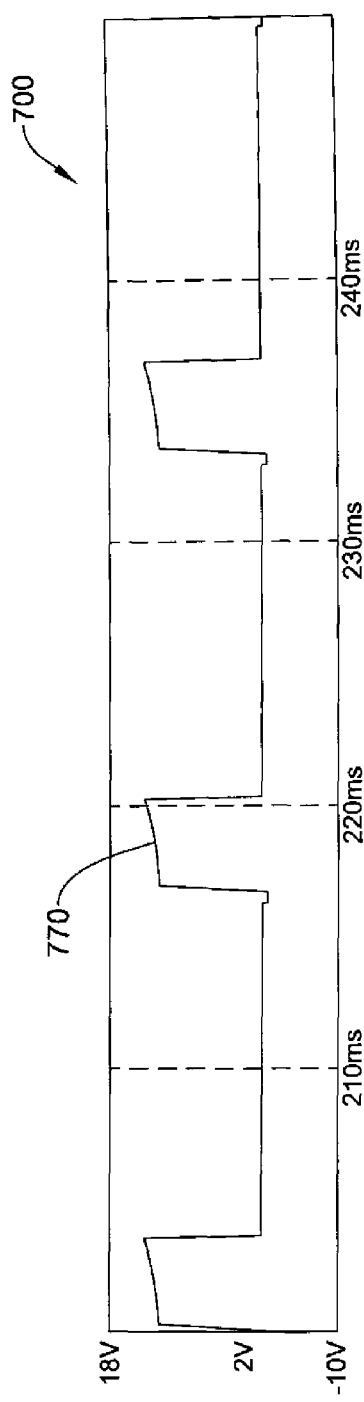
Figure 7D:
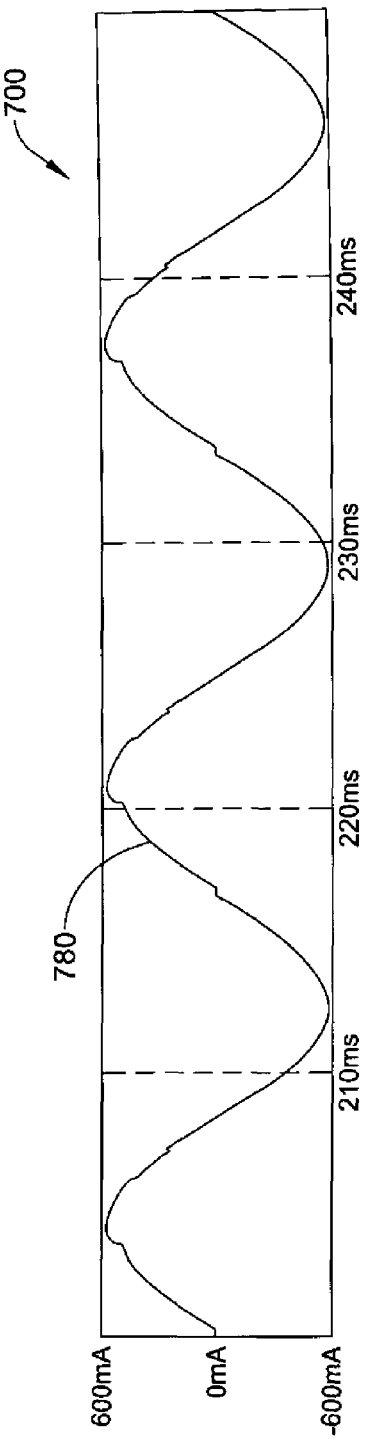
Figure 7E:
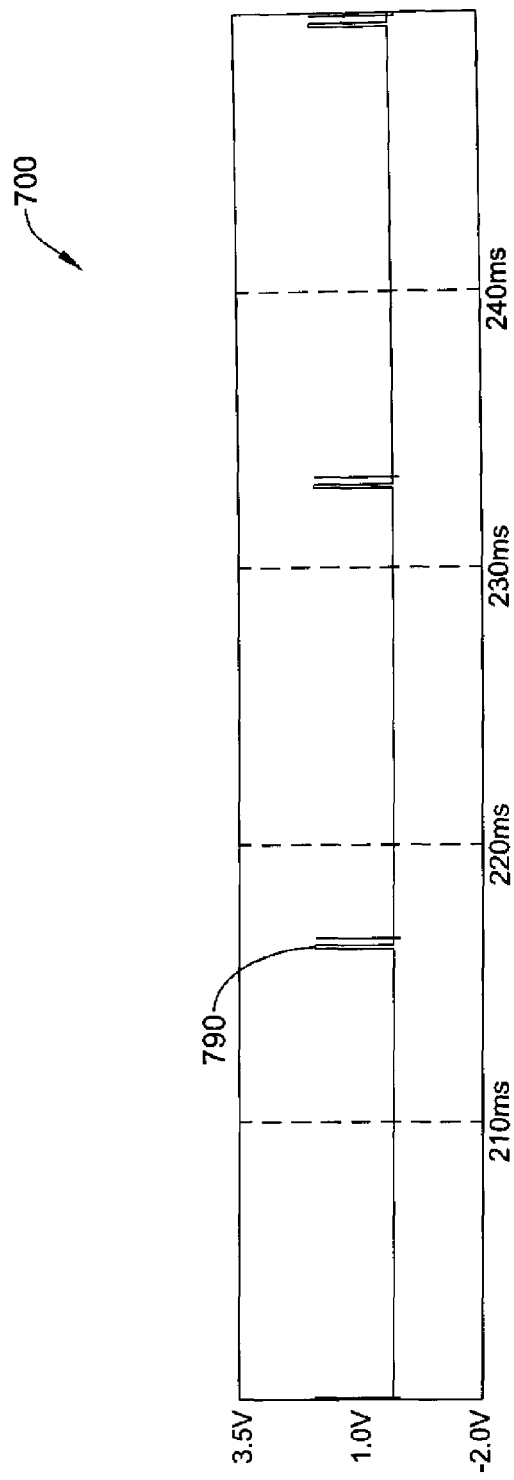

FIGS. 7A-7E are graphs showing illustrative waveforms for the schematic diagram of FIGS. 4-5, when full power is delivered to the load and with power applied to the load. FIGS. 7A-7E show waveforms similar to those of FIGS. 6A-6E. However, the waveforms of FIGS. 7A-7E correspond to a duration when current is provided to a load from the power source, such as by using a relay or other switch. For example, while under load, power may not flow through the capacitor of the switch circuit 320, so that the current waveform 680 has a magnitude of approximately 550 mA and is in phase with the voltage of the power source, as shown in FIG. 7D. As before, the pulse signal of FIG. 7E may correspond with the rising edge zero crossing of the current signal 680. While under load, the voltage waveform may now change as a result of the load, such as the voltage waveform 770 of FIG. 7C. FIG. 7B shows the voltage waveforms Vsigin 760 and Vrefin 750 that are compared by the comparator U1 of the zero crossing detection circuit 400 of FIG. 4 while the load is powered by the power source. The Vsync waveform 740 of FIG. 7A shows the signal output by the comparator U1 of FIG. 4 and used as the input to the compensation circuit 500. Similarly, the waveform Voffset 710 is compared to the voltage threshold Vref 510 by the comparators U5, U6 and is used to generate the compensation waveforms Voff– 720 and Voff+ 730.

FIGS. 8A-8E are graphs showing illustrative waveforms of the schematic diagram of FIGS. 4-5 when power to the load alternates between circuit power and full power and with the input offset V3 of FIG. 4 set to a non-zero value. In these figures representing simulated output of the circuits of FIGS. 4-5, the input offset voltage 430 of the comparator U1 of the zero crossing detection circuit 400 has been set to a specified value (e.g., about 10 mV). In these figures, three periods have been specified corresponding to the status of the relay powering the load connected to the power source 410. For example, the periods 801, 803 correspond to a time period where the relay is open (e.g., no power supplied to the load), and period 802 corresponds to a period where the relay is closed (e.g., power being supplied to the load).

Figure 8A:
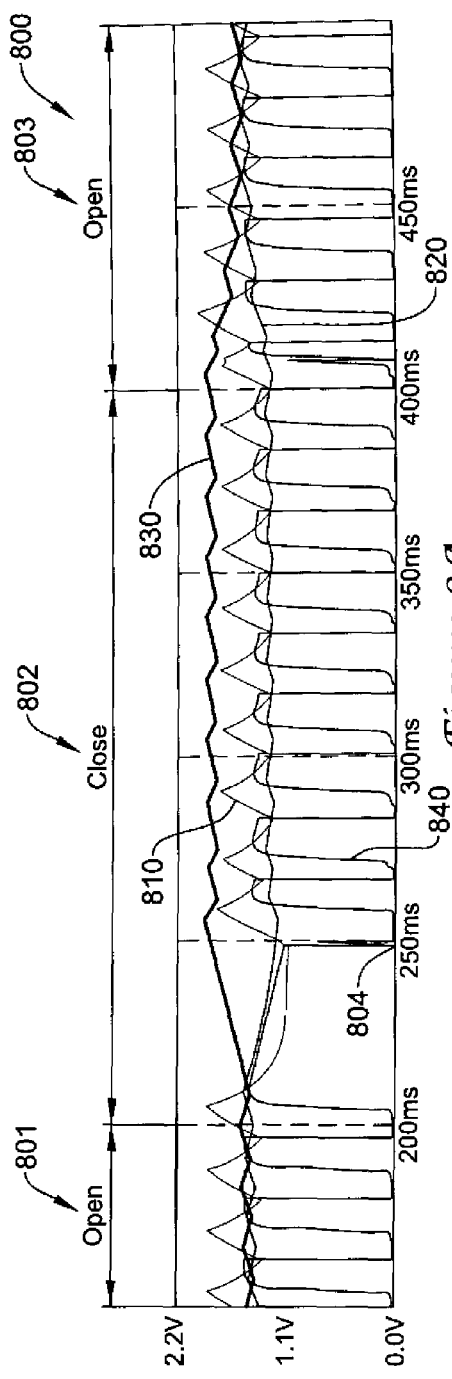
FIGS. 8A-8E are graphs showing illustrative waveforms of the schematic diagram of FIGS. 4-5 when power delivered to the load alternates between circuit power and full power and with the input offset V3 of FIG. 4 set to a non-zero value.
Figure 8B:
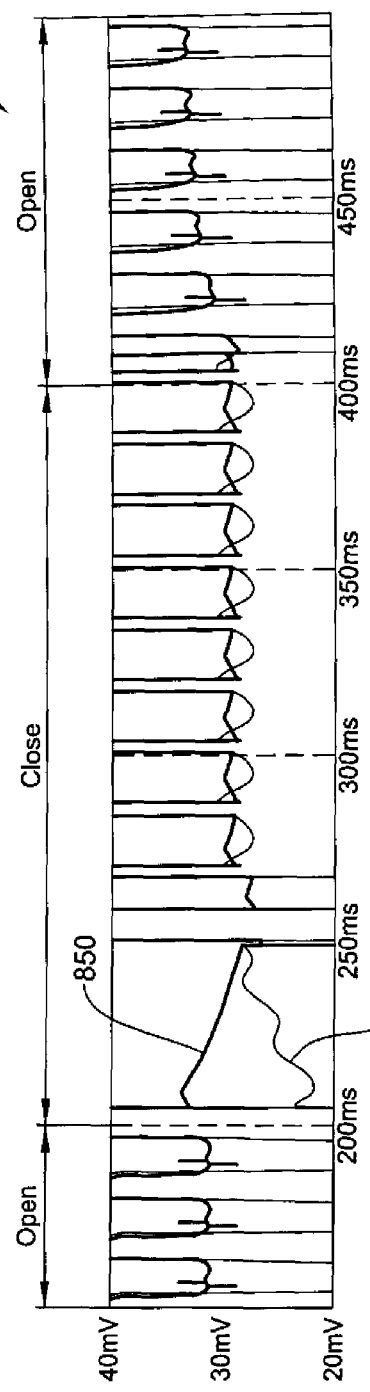
Figure 8C:
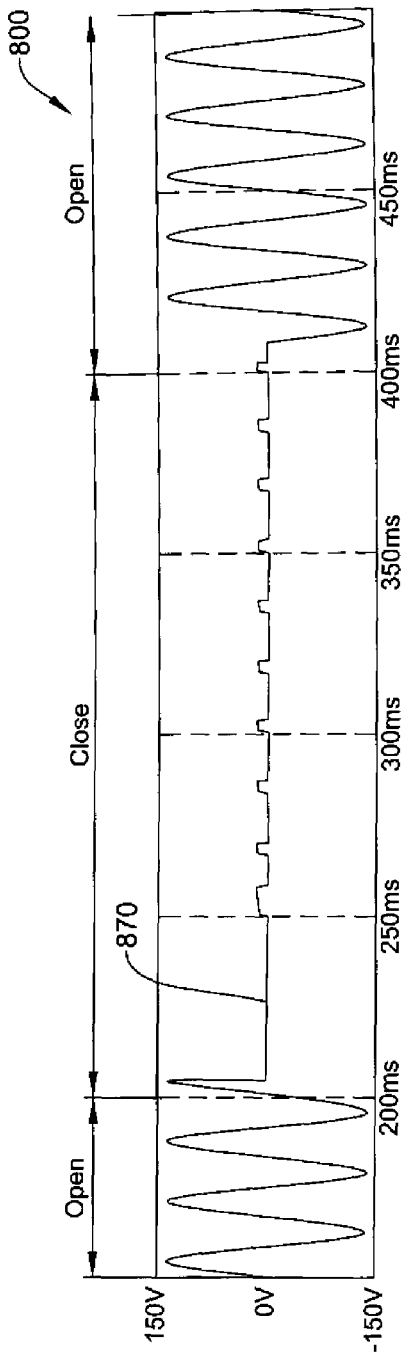
Figure 8D:
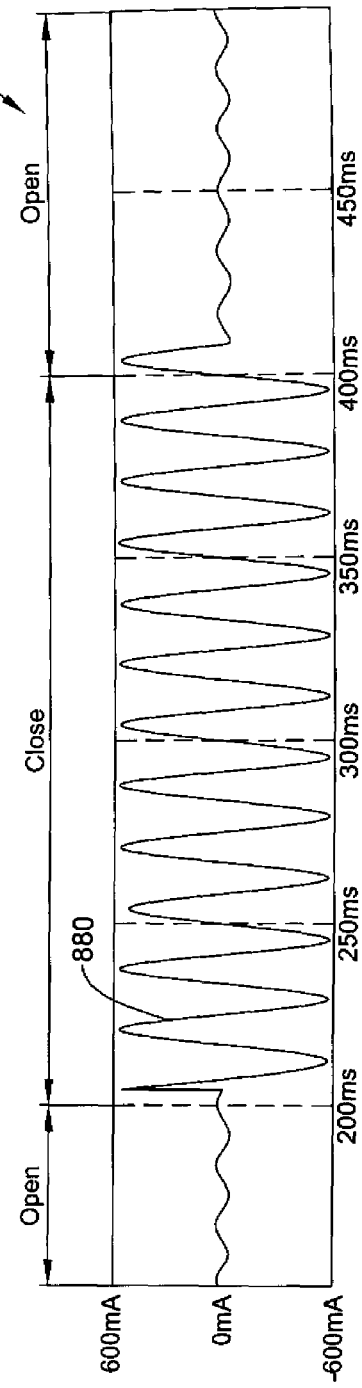
Figure 8E:
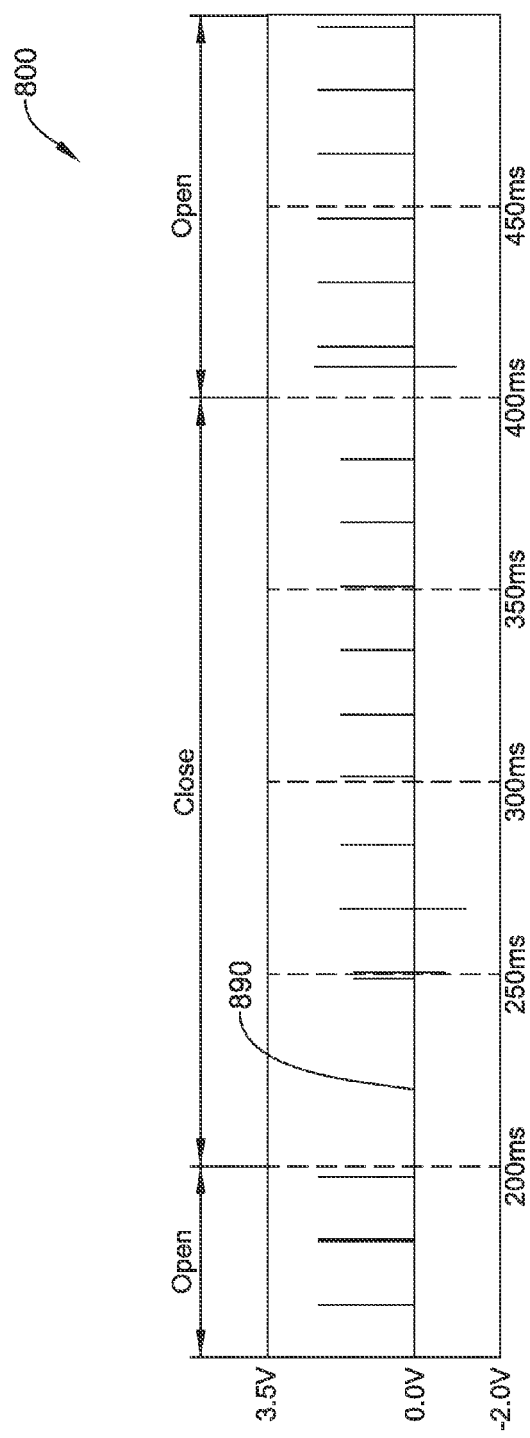

As can be seen in FIG. 8A, the waveforms of Voff– 830 and Voff+ 820 adjust to compensate for the input offset voltage V3 of the comparator U1. As can be seen, after the relay closes, at the start of the period 802, the Voff– signal 830 Voff+ 820 signals adjust until a time 804 is reached when the waveforms compared (e.g. Vrefin 850 and Vsigin 860 of FIG. 8B) fed into the compensation comparators stabilize. Without the compensation signals from the compensation circuit 500, the Vrefin waveform 850 and the Vsigin waveform 860 would not cross, so no power stealing would occur. As can be seen in FIGS. 8C, 8D and 8E, for approximately three cycles, the voltage waveform 870 and the current waveform 880 are not sufficient to overcome the input offset voltage V3 of the comparator U1 until the compensation circuit 500 is able to compensate for the input offset voltage V3 at time 804. That is, without the compensation circuit 500, the zero crossing detection circuit 400 would have missed the zero-crossing of the AC signal 410.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respect, only illustrative. Changes may be made in details, particularly in matters of shape, size, and arrangement of parts without exceeding the scope of the disclosure. The disclosure's scope is, of course, defined in the language in which the appended claims are expressed.

What is claimed is:

1. A system to compensate for an input offset voltage of a zero crossing detection circuit for a power stealing circuit, the system comprising:

an input configured to connect to an AC power source that provides power to a load;

a zero crossing detection circuit responsive to the input, the zero crossing detection circuit configured to determine a zero crossing of an input signal provided by the AC power source, and wherein the zero crossing detection circuit includes a comparator having an input offset voltage; and a compensation circuit responsive to the zero crossing detection circuit, wherein the compensation circuit is configured to provide a first compensation signal to an inverting input of the comparator of the zero crossing detection circuit, and a second compensation signal to a non-inverting input of the comparator of the zero crossing detection circuit, wherein the polarity of the first compensation signal is opposite to the polarity of the second compensation signal.

2. The system of claim 1, further comprising a switch to activate the power stealing circuit, the switch activated by an output of the zero crossing detection circuit.

3. The system of claim 2, wherein the switch includes a MOSFET.

4. The system of claim 2, wherein the input signal includes a first input signal during a period of time when the switch is open, and a second period of time when the switch is closed.

5. The system of claim 2, wherein the zero crossing detection circuit is configured to output a pulse signal, wherein the pulse signal corresponds to a zero crossing.

6. The system of claim 5, wherein the pulse signal is used to activate the switch for the power stealing circuit.

7. The system of claim 1, wherein the zero crossing detection circuit includes a comparator and outputs a zero-crossing signal associated with the zero crossing of the input signal; and the compensation circuit receives the zero-crossing signal from the zero crossing detection circuit and determines the first compensation signal and the second compensation signal using the zero-crossing signal.

8. The system of claim 7 wherein the compensation circuit includes:

a comparison circuit responsive to the zero crossing detection circuit, the comparison circuit is configured to compare the zero-crossing signal from the zero crossing detection circuit to a reference voltage, and in response, provide a first comparison signal and a second comparison signal;

a first charge storage device electrically coupled to the comparison circuit to receive the first comparison signal; and a second charge storage device, electrically coupled to the comparison circuit to receive the second comparison signal.

9. They system of claim 8, wherein the first compensation signal is dependent upon a voltage across the first charge storage device, and the second compensation signal is dependent upon a voltage across the second charge storage device.

10. The system of claim 7, wherein the compensation circuit includes a first comparator and a second comparator, wherein the first comparator receives the zero-crossing signal at an inverting input and a reference signal at a non-inverting input, and the second comparator receives the zero-crossing signal at a non-inverting input and the reference signal at an inverting input.

11. A system to compensate for an unwanted input offset voltage of a zero crossing detection circuit of a power stealing circuit, the system comprising:

an input configured to connect to an AC power source that provides an AC input signal to a load;

a zero crossing detection circuit configured to determine a zero crossing of the AC input signal at the input, the zero crossing detection circuit having an unwanted input offset voltage; and a compensation circuit for at least partially compensating for the unwanted input offset voltage of the zero crossing detection circuit, the compensation circuit configured to provide compensation to the zero crossing detection circuit based, at least in part, on a measure related to a difference between an amount of time that the AC input signal is above a reference voltage and an amount of time the AC input signal is below the reference voltage.

12. The system of claim 11, further comprising:

a switch for stealing power from the AC power source and providing the stolen power to a device; and wherein the switch is controlled to steal power from the AC power source when the zero crossing detection circuit determines a zero crossing of the AC input signal has occurred.

13. The system of claim 12, wherein the device is a thermostat.

14. The system of claim 12, wherein the switch includes a MOSFET.

15. The system of claim 11, wherein the zero crossing detection circuit is configured to output a pulse signal, wherein the pulse signal corresponds to a zero crossing.

16. The system of claim 15, wherein the pulse signal is used to activate a switch for stealing power from the AC power source and providing the stolen power to a device.

17. A method comprising:

receiving an AC input signal from an AC power source that provides power to a load;

determining a zero crossing of the AC input signal using a zero crossing detection circuit having an unwanted input offset voltage;

identifying a measure related to a difference between an amount of time that the AC input signal is above a reference voltage and an amount of time the AC input signal is below the reference voltage;

at least partially compensating for the unwanted input offset voltage of the zero crossing detection circuit based, at least in part, on the measure related to the difference between the amount of time that the AC input signal is above the reference voltage and the amount of time the AC input signal is below the reference voltage.

18. The method of claim 17, further comprising:

switching a switch to steal power from the AC power source when a zero crossing of the AC input signal is determined.

19. The method of claim 18, wherein the switch directs stolen power from the AC power source to a thermostat when a zero crossing of the AC input signal is determined.

20. The system of claim 17, wherein the zero crossing detection circuit is configured to output a pulse signal, wherein the pulse signal corresponds to a zero crossing.

* * * * *